US012733531B2

(12) United States Patent
Schmidt

(10) Patent No.: US 12,733,531 B2

(45) Date of Patent: Sep. 8, 2026

(54) METHOD FOR COPPER-TO-COPPER DIRECT BONDING AND ASSEMBLY

(71) Applicant: Atotech Deutschland Gmbh & Co. KG, Berlin (DE)

(72) Inventor: Ralf Schmidt, Berlin (DE)

(73) Assignee: Atotech Deutschland Gmbh & Co. KG, Berlin (DE)

(*) Notice: Subject to any disclaimer, the term of this patent is extended or adjusted under 35 U.S.C. 154(b) by 471 days.

(21) Appl. No.: 18/549,211

(22) PCT Filed: Mar. 4, 2022

(86) PCT No.: PCT/EP2022/055528

§ 371 (c)(1), (2) Date: Sep. 6, 2023

(87) PCT Pub. No.: WO2022/189283

PCT Pub. Date: Sep. 15, 2022

(65) Prior Publication Data

US 2024/0170428 A1 May 23, 2024

(30) Foreign Application Priority Data

Mar. 6, 2021 (EP) .................................... 21161148

(51) Int. Cl.

*H01L 23/48* (2006.01)
*H01L 23/52* (2006.01)
(Continued)

(52) U.S. Cl.

CPC ......... *H10W 72/90* (2026.01); *H10W 72/019* (2026.01); *H10W 99/00* (2026.01);
(Continued)

(58) Field of Classification Search

CPC ......... H01L 24/08; H01L 24/03; H01L 24/80; H01L 2224/03462; H01L 2224/05647;
(Continued)

(56) References Cited

U.S. PATENT DOCUMENTS

| | | | |
|---|---|---|---|
| 9,881,888 | B2 | 1/2018 | Chen et al. |
| 10,204,893 | B2 | 2/2019 | Uzoh |

(Continued)

FOREIGN PATENT DOCUMENTS

| | | | |
|---|---|---|---|
| JP | 2021197430 | A | 12/2021 |
| WO | 2020046677 | A1 | 3/2020 |
| WO | 2022187402 | A1 | 9/2022 |

OTHER PUBLICATIONS

PCT/EP2022/055528; International Search Report and Written Opinion of the International Searching Authority dated Jun. 10, 2022.

(Continued)

*Primary Examiner* — Niki H Nguyen

(74) *Attorney, Agent, or Firm* — Renner, Otto, Boisselle & Sklar, LLP

(57) ABSTRACT

The invention relates to method for copper-to-copper direct bonding comprising the steps:

a) providing a first substrate comprising a first pure copper deposit having a bonding surface;
b) providing a second substrate comprising a second pure copper deposit having a bonding surface;
c) connecting the bonding surface of the first deposit with the bonding surface of the second deposit and obtaining a connected deposit; and
d) converting the first deposit and the second deposit of the connected deposit into a connected and converted deposit, wherein the first deposit and the second deposit are formed by an electrochemical copper deposition step (Continued)

and having copper grains with a grain size which is smaller than a grain size after the converting in step d), wherein the connected and converted deposit is having grains with a grain size which is larger than the grain size of the first deposit and the second deposit before the converting in step d); and to an assembly and a device produced by the method.

16 Claims, 4 Drawing Sheets

(51) Int. Cl.
*H01L 29/40* (2006.01)
*H10W 72/00* (2026.01)
*H10W 72/90* (2026.01)
*H10W 99/00* (2026.01)
*H10W 80/00* (2026.01)
*H10W 90/00* (2026.01)

(52) U.S. Cl.
CPC .... *H10W 72/01935* (2026.01); *H10W 72/952* (2026.01); *H10W 80/312* (2026.01); *H10W 80/327* (2026.01); *H10W 90/792* (2026.01)

(58) Field of Classification Search
CPC . H01L 2224/08145; H01L 2224/80896; H01L 24/05; H01L 2224/80895; H01L 2224/08147; H01L 2224/11462; H01L 2224/13147; H01L 2224/03848; H01L 2224/05147; H01L 2224/08123; H01L 25/0657; H01L 24/94; H01L 24/02; H01L 24/09
See application file for complete search history.

(56) References Cited

U.S. PATENT DOCUMENTS

| | | | | |
|---|---|---|---|---|
| 2015/0061115 | A1 | 3/2015 | Chen | |
| 2016/0093583 | A1* | 3/2016 | Yu | H10W 20/20 257/737 |
| 2019/0096741 | A1* | 3/2019 | Uzoh | H10W 20/46 |
| 2020/0395339 | A1* | 12/2020 | Chen | H10W 90/00 |
| 2021/0020599 | A1 | 1/2021 | Chen | |
| 2022/0285303 | A1* | 9/2022 | Mirkarimi | H10W 72/90 |

OTHER PUBLICATIONS

Rebhan B et al.; “Physical mechanisms of copper-copper wafer bonding”, Journal of Applied Physics, American Institute of Physics, US, vol. 118, No. 13, Oct. 7, 2015.

Chuan Seng Tan; “Recent progress in copper-based wafer bonding for 3-D ICs application”, 2008 International Conference on Electronic Materials and Packaging: (EMAP 2008) ; Taipei, Taiwan, Oct. 22-24, 2008; [In Conjunction With the 3rd International Microsystems, Packaging, Assembly and Circuits Technology Conference (Impact)], IEEE, Oct. 22, 2008, pp. 45-48.

Juang Jing Ye et al.; “Low resistance and high reliable Cu-to-Cu joints using highly (111)-oriented nano-twinned copper”, 2019 International Conference on Electronics Packaging (ICEP), Japan Institute of Electronics Packaging, Apr. 17, 2019, pp. 212-215.

Beilliard Y et al.; “Advances toward reliable high density Cu—Cu interconnects by Cu—SiO2 direct hybrid bonding”, 2014 International 3D Systems Integration Conference (3DIC), IEEE, Dec. 1, 2014, pp. 1-8.

Zhang Xiaowu et al.; “Heterogeneous 2.5D integration on through silicon interposer”, Applied Physics Reviews, vol. 2, No. 2, Jun. 1, 2015, p. 021308.

* cited by examiner

METHOD FOR COPPER-TO-COPPER DIRECT BONDING AND ASSEMBLY

This application is a national phase of International Application No. PCT/EP2022/055528, filed 4 Mar. 2022, which claims priority to European Patent Application No. 21161148.8, filed 6 Mar. 2021, each of which is hereby incorporated herein by reference in its entirety.

FIELD OF THE INVENTION

The present invention relates to a novel method for copper-to-copper direct bonding for the manufacturing of an assembly, in particular the invention relates to the manufacturing of an assembly interconnecting conductive copper structures in a wafer-to-wafer process, a die-to-wafer process, or a die-to-die process in the semiconductor industry.

BACKGROUND OF THE INVENTION

Facing a demand for increasing miniaturization, modern electronics manufacturers must pursue the trend to more and more densely electrical interconnects. Heterogeneous integration is considered as the key technology to meet current and upcoming requirements of the semiconductor industry. It involves the integration of separately produced components into an assembly, which provides enhanced functionality and improved operating characteristics. Copper constitutes the main interconnect material for the individual components as well as for their packaging. In this context, 3D stacking of components within a package allows for increasing the interconnect density, decreasing form factor, and increasing efficiency.

Bonding of the individual components is required in the different processes as wafer-to-wafer process, a die-to-wafer process, or a die-to-die process. Conventional bonding technologies involve copper bumps and pillars in combination with solder material and are widely employed in current packaging applications. Such copper pillars are usually produced by electrolytic copper deposition. However, common processes usually suffer from relatively large nonuniformities in the range of several micrometers, especially with regard to coplanarity and total thickness variation. The solder material, usually tin or tin-silver alloys, allows to compensate for these nonuniformities to a certain extent.

Increase of the interconnect density involves shrinking distance between the copper bumps and pillars. Conventional solder technologies may not be suitable for fine pitch applications since the solder material could be squeezed out from the structures during bonding and create electrical shorts. Direct formation of copper-to-copper interconnects may overcome these issues by omitting conventional solder caps for microbumps and, thereby, to scale down the pitch between the bumps to values distinctly below 20 μm. Therefore, several attempts were proposed to improve bond formation including surface activation by ion beams, chemical-mechanical polishing (CMP), surface passivation by alloying the copper with other elements, metal and organic finishes, and structural design.

Since many applications include temperature-sensitive devices, a low-temperature alternative bonding technology is required. Hybrid bonding, which involves direct copper-to-copper interconnects that are encapsulated by silicon dioxide, was proposed as promising alternative.

WO 2020046677 A1 describes a hybrid bonding process wherein structures provide a vertical stack of conductive layers confined by a surrounding dielectric with geometries and thermal expansion features designed to vertically expand the stack over precise recess distance at lower temperatures to make the direct copper-to-coper bonds at the bonding interface without solders or adhesives. In the first phase the oxide surfaces of the inorganic dielectrics direct-bonds together and wherein in the second phase the metal confined by the surrounding dielectric direct-bonds together. The copper-to-copper bonding bases on surface diffusion of copper atoms which diffuse across the interface to form permanent bonds.

U.S. Pat. No. 9,881,888 B2 discloses a Cu-to-Cu interconnect structure with a coarser average grain size at the body of one copper post and a finer average grain size at an outer surface of said copper post. A portion of the outer surface of the copper post and another copper surface are then contacted, pressurized, and heated to achieve copper to copper fusion.

Chuan Seng Tan: "Recent progress in copper-based wafer bonding for 3-D ICs application", 2008 INTERNATIONAL CONFERENCE ON ELECTRONIC MATERIALS AND PACKAGING: (EMAP 2008) IEEE, 22 Oct. 2008 (2008-10-22), pages 45-48, discloses thermo-compression bonding (also known as diffusion bonding) of metallic copper and its application in 3-D stacking of ICs, wherein Blanket Cu films deposited on two oxide wafers are found to merge and form a homogeneous layer under suitable bonding conditions, i.e., at a temperature range of 300-400° C. and contact pressure—226 kPa.

However, the aforementioned approach does not fulfill the up-comings requirements for increasing miniaturization. There is still a demand to improve bond formation and bonding strength as well as ductility. Since many applications include temperature-sensitive devices, a low annealing temperature is also still required in order to avoid damages of the components and loss of conductivity.

OBJECTS OF THE INVENTION

Therefore, it is an object of the present invention to overcome shortcomings of the prior art and to provide means for improved bond formation and bonding strength.

It is a further object of the present invention to provide means for reducing the annealing temperature during the copper-to-copper direct bonding.

It is still another object of the present invention to reduce the number of method steps and provide an improved bonding surface for the to be bonded deposits.

It is still another object of the present invention to improve the electromigration within the formed copper-to-copper bonding.

SUMMARY OF THE INVENTION

These objects are solved with the present invention.

In one aspect of the present invention, a method for copper-to-copper direct bonding comprising the steps:

a) providing a first substrate comprising a first pure copper deposit having a bonding surface, preferably the first substrate is a wafer-like or a die-like substrate;

b) providing a second substrate comprising a second pure copper deposit having a bonding surface, preferably the second substrate is a wafer-like substrate or a die-like substrate;

c) connecting the bonding surface of the first deposit with the bonding surface of the second deposit and obtaining a connected deposit;

d) converting the first deposit and the second deposit of the connected deposit into a connected and converted deposit, wherein the first deposit and the second deposit are formed by an electrochemical copper deposition step and having copper grains with a grain size which is smaller than a grain size after the converting in step d), preferably the grain size is nanocrystalline, more preferably the grain size is on average less than 0.8 μm, more preferably from 0.01 μm to 0.70 μm, most preferably from 0.01 to 0.3 μm;

wherein the connected and converted deposit is having grains with a grain size which is larger than the grain size before the converting in step d), preferably the grain size is on average from 0.1 μm to 13 μm, more preferably from 1 to 10 μm wherein the step d) is conducted by applying an annealing step having an annealing temperature equal to or less than 200° C., preferred from 150° C. to 200° C.

In another aspect of the present invention, an assembly comprising:

i) a connected and converted deposit obtained by connecting a bonding surface of a first pure copper deposit of a first substrate with a second bonding surface of a second pure copper deposit of a second substrate, and by converting the first deposit and the second deposit of the connected deposit into a connected and converted deposit, wherein first deposit and the second deposit are formed by an electrochemical copper deposition step and having copper grains with a smaller grain size compared with copper grains of the connected and converted deposit having larger grain size after applying an annealing step having an annealing temperature equal to or less than 200° C., preferred from 150° C. to 200° C., preferably the grains of the first deposit extend through the bonding surface of the first and second deposit into the second deposit and vice versa.

In still another aspect of the present invention, a device comprising an assembly comprising:

i) a connected and converted deposit obtained by connecting a bonding surface of a first pure copper deposit of a first substrate with a second bonding surface of a second pure copper deposit of a second substrate, and by converting the first deposit and the second deposit of the connected deposit into a connected and converted deposit, wherein first deposit and the second deposit are formed by an electrochemical copper deposition step and having copper grains with a smaller grain size compared with copper grains of the connected and converted deposit having larger grain size after applying an annealing step having an annealing temperature equal to or less than 200° C., preferred from 150° C. to 200° C.;

wherein the first and second substrate is part of a microelectronic device, preferably a wafer or a die.

In particular the present invention avoids additional method steps e.g. the modification of the bonding surface structure before the bonding step and provides a smooth bonding surface and additional steps to reduce the bonding temperature as Surface Activated bonding using ultrahigh vacuum (UHV) condition or Cu Nanorod method using copper nanorod arrays as a bonding intermediate layer are prevented.

The present invention, wherein complex steps of inserting certain structures into the bonding surfaces are avoided, helps to reduce the need of a CMP step in order to further smoothen the bonding surface to provide an even/smooth surface with very low surface roughness. In this context, smooth surface means that the surface roughness Ra is below 300 nm, preferably below 50 nm. Preferably the surface roughness Ra in the range from 5 nm to 200 nm, more preferable from 10 nm-50 nm, even more preferable from 10 nm-40 nm, and/or the deviation of the average thickness of the deposits is from 5 to 10%.

Because the metal deposits were formed by an electrochemical copper deposition step, the bonding surfaces of the metal deposits are already very smooth. However, in some case a short CMP step can be useful if a surface roughness Ra of less than 10 nm is required, and/or CMP is used as short cleaning step to prepare the bonding surfaces of the substrates, in particular a short CMP is used to remove e.g. copper oxides and/or to remove particle as microscopic dust.

Further, no distinct interface (area where the bonding surfaces touches each other) can be detected after converting step which highly improves the bonding strength, bonding formation and electromigration performance. That means, the smooth surfaces of the former bonding surfaces (which would form a distinct interface before converting) are not distinct or more or less no detectable anymore after converting. In stead of, the surfaces of the former bonding surfaces are becoming indistinct and are merging (going at least partly into one another) because the grains of the deposits are growing from both sides through the surfaces to the other side.

Further aspects of the present invention could be learned from the dependent claims or the following description.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE INVENTION

Figure 1:
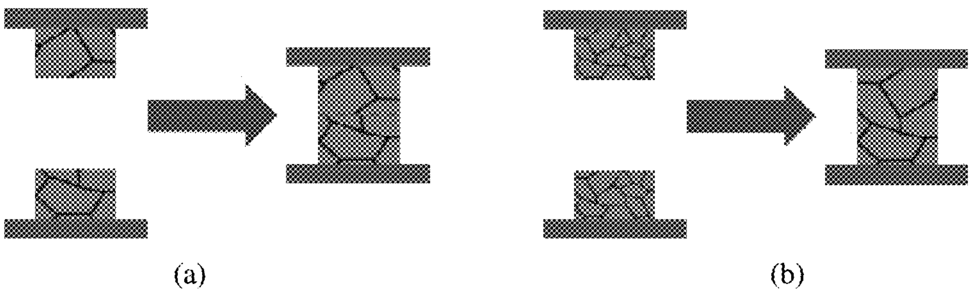
FIG. 1 illustrates the formation of the copper-to copper direct bonding.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention".

In the following description of embodiments of the present invention, the terms of a singular form may include plural forms unless the context clearly indicates otherwise, e.g. if in the following 'deposit' is used 'deposits' is included. Further "on average" means that the number is the average of several numbers, wherein certain numbers might be higher or lower than the average number.

In the context of the present invention, pure copper denotes the purity of the copper deposit which means a copper content of the copper deposit of 99 wt.-%, preferred of 99.9 wt.-%, more preferred of 99.99 wt.-%, is deposited, or respective pure copper deposit means copper deposit of at least 99 wt.-% copper content, preferred of at least 99.9 wt.-%, more preferred of at least 99.99 wt.-%. The pure copper in particular does not contain any alloying metals or organic residues with in the before mentioned wt.-%.

The first substrate and the second substrate can be part of an assembly after applying the inventive method and/or can be part of a microelectronic device as a wafer-like substrate or a die-like substrate to be processed with the present invention. The connecting of the bonding surfaces according to the inventive method may be one step in a wafer to wafer (W2W) process, a die-to-wafer (D2W) process, or a die-to-die (D2D) process.

The first substrate and the second substrate may further comprise independently from each other an additional metal deposits having a different metal composition, e.g. a copper alloy, and forming a vertical stack. The additional metal deposit of the first substrate is connected with the first deposit and the additional metal deposit of the second substrate is connected with the second deposit. Each additional metal deposit has a respective coefficient of thermal expansion (COE). The first and second deposit as well as the additional metal deposits may be confined by dielectric material. The manufacturing of these substrates is known in principle by the skilled person.

The first substrate may comprise further a first nonconductive material, e.g. a dielectric material, having a bonding surface and at least partially confining the first deposit and wherein the second substrate comprises further a second nonconductive material, e.g. a dielectric material, having a bonding surface and at least partially confining the second deposit. wherein the bonding surface of the first and second deposit is below or even to (at the same level of) the surface of the bonding surface of the first and second nonconductive material.

The first deposit of the first substrate and the second deposit of the second substrate can be independently selected from the group consisting of a via, a bump, a pillar and/or a pad.

While the prior art focused on optimization of the CMP, oxide-to-oxide bonding process steps of connecting the dielectric material confining the copper vias as well as an improved diffusion of copper atoms at the copper surface between the bonding surfaces of the to be bonded substrates, the present invention deals with different aspects of the copper deposits before and after bonding in view of grain size of the copper grains and purity of the copper deposits with respect to the electrodeposition process and improved conditions for the subsequent copper-to-copper bonding process in a hybrid bonding process sequence relating to time and annealing temperature.

The present invention mainly bases on two findings, firstly that the crystalline structure of the deposit shall not be modified after plating and conserved until the copper-to-copper bonding process is initiated and secondly that the initiated grain growth of grains within the copper-to-copper process (mainly step d)) leads to grains which are going through the former even bonding surface of one deposit into the other deposit wherein the former even bonding surfaces disappear or mainly disappear. This connected and converted deposit shows improved bonding strength and highly improved reliability of the connected (and converted) deposits.

Own experiments have shown the timescale to maintain small grains at room temperature was found to depend on the electrolytic copper process and could be controlled by proper adjustment of the deposition parameters. In particular the purity of the copper deposit and the used temperature for copper deposition allow preserve microstructures, which resembled the initial morphology, for long times at room temperature. The resulting timescale should be sufficient for implementation into an industrial hybrid bonding process sequence. Without to be bond on theory, grain growth over interfaces (bonding surfaces of the deposits) starts according to the invention preferably from the initial structure upon application of a thermal load during conversion mitigated by e.g. the annealing step.

In particular it was found that the annealing temperature of copper electrodeposits may be influenced as a function of the co-deposited impurities, which depend amongst others on the organic plating additives and plating conditions, and that the annealing temperature can be lowered to account for the requirements of the bonding process flow and the resulting package quality.

The converting step of present invention is in particular applied after the electrochemical copper deposition step to provide the pure copper deposits, in particular after providing the conductive copper structures as vias on the substrates. Preferably the converting step is applied after the electrochemical copper deposition step without further heat treatment e.g. without an annealing step before applying the present invention. That means the copper deposits are exposed after the electrolytic process only to temperatures below or equal to ambient (room) temperature.

Preferably the time period after step a) and b) does not exceed 3 weeks, more preferable does not exceed 120 hours, even more preferable does not exceed 72 hours, until step c) and/or d) is conducted. Preferably the substrates of step a) and b) are stored during the time period at ambient temperature (in the range from 18 to 25° C.), preferably below or equal 25, more preferably in the range from 5° C. to 25 C.

According to the invention, step c)—connecting the bonding surface of the first deposit with the bonding surface of the second deposit and obtaining a connected deposit—is understood as bringing at least parts of the bonding surfaces of the deposits of the substrates in direct contact with each other, e.g., by aligning the substrates face-to-face and clamping the substrates together on a bonding chuck.

In case the first substrate comprises a first nonconductive material having a bonding surface and at least partially confining the first deposit and wherein the second substrate comprises further a second nonconductive material having a bonding surface and at least partially confining the second deposit. wherein the bonding surface of the first and second deposit is below (or partly below) or at the same level of the bonding surface of the first and second nonconductive material, the step c) comprises bringing at least parts of the bonding surfaces of nonconductive material of the substrates in direct contact with each other, e.g., by aligning the substrates face-to-face and clamping the substrates together on a bonding chuck. This connecting can be achieved by pressing the first and second bonding surface of the nonconductive material of the first and second substrate together under a certain pressure. In this embodiment the bonding surfaces of the first and second deposit of the first and second substrate are either at the same time in contact with each other as the bonding surfaces of the nonconductive material or are at least partly in contact after the bonding surfaces of the nonconductive material are bonded.

The pressure can be applied with a contact force from 1 to 5,000 N. In one embodiment, the contact force in step c) can be from 3,500 to 4,500 N, when the substrates are in full contact.

Step c) can be conducted without applying higher temperature, in particular conducting at a temperature under 100° C., preferably conducting at ambient or room temperature (preferably in the range from 18 to 25°) C.

The method according to the invention can be used in the manufacturing of an assembly and/or a device in packaging applications.

With the present invention it is possible to improved bond formation and bonding strength of the copper deposits between the substrates to be bonded.

The grain growth over the bonding interface (the area where the bonding surface of the first and second deposit are in touch with each other) was achieved and is highly important for good and sufficient copper-to-copper bond formation and for high reliability. Growth of grain size (small grains provided by the electrochemical deposition as starting point) is prevented, at least delayed or slowed down before and until the converting step is started.

The copper grains of the first and second deposit after electrochemical copper deposition step having a grain size which is preferably nanocrystalline which means the grain size is less than 1 μm, more preferably the grain size is on average less than 0.8 μm, more preferably from 0.01 μm to 0.70 μm, most preferably from 0.01 to 0.3 μm.

The copper grains of the connected and converted deposit has a grain size which is on average from 0.1 μm to 13 μm, more preferably from 1 to 10 μm, most preferably from 1 μm to 5 μm. In principle the grain size of the copper grains of the connected and converted deposit is only limited by the thickness ((length of the area of the first and the second deposit together) of the connected and converted deposit.

After the connecting step c) the grain size of the first deposit and the grain size of the second deposit are now parts of the connected deposit and during the converting step d) the grain size is growing and the formed copper grains extend through the bonding surface of the first deposit and second deposit (also named as interface where both bonding surfaces are touching each other) into the respective other deposit, means grains from the first deposit into the second deposit and vice versa. Vice versa means in this context that also the grain size of the second deposit is growing and the formed copper grains of the second deposit extend through the bonding surface of the second deposit into the first deposit (again also named as interface where both bonding surfaces are touching each other). In consequence, the formerly connected bonding surfaces of the deposits having an even trend (forming an interface) are disappeared and the copper grains prolong through (the area of) the connected and converted deposit, preferably through at least 75 percent or more (of the area) of the connected and converted deposit, more preferably through the whole (area of the) connected and converted deposit. E.g. if the area of the connected and converted deposit has a maximal length of 5 μm (length of the area of the first and the second deposit together) the copper grains may have preferably a length up to 5 μm, e.g. from 4 to 5 μm.

Preferably the grains of the first deposit and the second deposit having the smaller grain size before the converting step are almost fully (means more that 90% of the smaller grain size) converted into the grains of the larger grain size of the connected deposit wherein the grains of the larger grain size are going through the connected deposit.

Preferably the connected and converted deposit has no or at least partly no detectable bonding surface (interface) between the former first deposit and the former second deposit. The former even, smooth surface cannot be seen at least partly anymore by e.g. FIB SEM microscopy after conversion.

In one embodiment the grains of the first deposit and the second deposit having the smaller grain size are almost fully (means more that 90% of the smaller grain size) converted into the grains of the larger grain size of the connected deposit wherein the grains of the larger grain size are going through the connected deposit and the connected deposit has no detectable bonding surface (interface) between the former first deposit and the former second deposit after converting step d).

No detectable bonding surface (interface between both bonding surfaces after converting) between the former first deposit and the former second deposit in context of the present invention means that former existing bonding surface of the first and second deposit after step a), b) or c), before conducting step d) will no longer be detectable as smooth/even surface because of the growing of the grain size of each deposit into the respective other deposit by growing from nanocrystalline to grain size which is on average from 0.1 μm to 13 μm. With other words, the bonding surfaces or at least parts of the bonding surfaces (also called interface between these bonding surfaces) are no longer detectable as belonging to the former deposit. Instead of the former distinct surfaces or at least parts thereof are now merged together and going into another one. This is in contrast to prior art, wherein deposits are used, wherein the grain size cannot grow, or the grain size is already converted before the bonding step or converting step, e.g. shown in the comparative examples.

No "detectable" bonding surface (interface) in this context means, that the detection of the bonding surfaces of the copper deposits or at least parts of the surfaces (having an even trend) before converting in step d) are not or partly not visible/observable as belonging to the former deposit) by known methods as EBSD (Electron Backscattered Diffraction), or FIB SEM microscopy after converting in step d).

The converting step d) is conducted by applying an annealing step having an annealing temperature equal to or less than 200° C., preferred from 150° C. to 200° C., more preferred from 150° C. to less than 200° C. Preferably the annealing time is from 10 min to 90 min.

In case of a D2W or D2D process the annealing time is preferably from 45 min to 75 min, most preferably 60 min with an annealing temperature preferred from 150° C. to 200° C., more preferred from 150° C. to less than 200° C. In case of a W2W process the annealing time is preferably from 10 min to 20 min with an annealing temperature preferred from 150° C. to 200° C., more preferred from 150° C. to less than 200° C.

In another embodiment, step c) is conducted together with step d) wherein the used temperature in step c) is the annealing temperature of step d). In this embodiment, the connecting step and the converting step take place at the same time by applying an annealing step having an annealing temperature equal to or less than 200° C., more preferred from 150° C. to 200° C., most preferred from 150° C. to less than 200° C. In this embodiment the first deposit and the second deposit undergoes thermal expansion and the copper grains of the first deposit and the second deposit are also starting to convert and extend respectively and bringing the bonding surface of the first deposit and bonding surface of the second deposit into contact with each other and in consequence finally the growing copper grains of the first and second deposit are touching and penetrate each other and forming the connected and converted deposit. In a special embodiment, the temperature is increased step-by-step up to the annealing temperature mentioned above.

The thermal expansion may be supported by additional metal deposits of the first and second substrate which are attached to the first and second deposit on the opposite side of the bonding surface (not attached to the bonding surface). The additional metal deposits may have more than one metal composition, e.g. a copper alloy, and each additional metal deposit has a respective coefficient of thermal expansion (COE). This will also mitigate the connecting step c) and in consequence bringing the bonding surfaces of the first and second deposit into contact.

Preferably the method of the present invention is a direct hybrid bonding method wherein the first substrate comprises further a first nonconductive material, e.g. a dielectric material, having a bonding surface and at least partially confining the first deposit and wherein the second substrate comprises further a second nonconductive material, e.g. a dielectric material, having a bonding surface and at least partially confining the second deposit. wherein the bonding surface of the first and second deposit is below or even to the plane surface of the bonding surface of the first and second nonconductive material. In this embodiment, the bonding surface of the nonconductive material is firstly connected (if the bonding surface of the first and second deposit is below) by bringing at least parts of the bonding surfaces of nonconductive material of the substrates in direct contact with each other, e.g., by aligning the substrates face-to-face and clamping the substrates together on a bonding chuck under conditions as explained above, and subsequently followed connecting the bonding surfaces of the deposits and step d). If the bonding surface of the first and second deposit is at the same height to the bonding surface of nonconductive material both bonding steps (connecting steps) take place at the same time. Preferably steps c) and d) are conducted together, wherein during connecting the bonding surfaces (of the nonconductive material and of the deposits) of the substrates are heated up from ambient temperature to the annealing temperature above. By heating-up the temperature step d) is conducted almost at same time or starts if the annealing temperature is reached. In principle, the process flow for direct hybrid bonding includes after electrolytic copper deposition CMP and two bonding steps within step c). Thus, first bonding of the dielectric material and second or at the same time bonding of the first and second deposit. This hybrid bonding method as such is in principle known by the skilled person and e.g. explained in WO 2020046677 A1. The nonconductive material can be a material basing SiO2, SiCN, SiN or a polymer as polyimide (PI). Because the copper deposits were formed by an electrochemical copper deposition step, the bonding surfaces of the metal deposits are already very smooth (preferably having a surface roughness Ra from 10 nm to 30 nm). However, in some case a short CMP step can be useful, if a surface roughness Ra of less than 10 nm is needed and/or cleaning is required.

Alternatively step c) can be conducted without applying higher temperature, in particular conducting at a temperature under 100° C., preferably conducting at ambient or room temperature (preferably in the range from 18 to 25°) C. and step d) is conducted preferably direct subsequently.

Every electrochemical aqueous copper deposition bath can be used which provides a first and a second pure copper deposit having copper grains with small grain size, preferably nanocrystalline. The aqueous acidic copper plating bath is preferably operated in the method according to the present invention in a temperature range of 15° C. to 40° C., more preferably in a temperature range of 20° C. to 35° C. by applying an electrical current to the substrate and at least one anode.

As explained at the beginning, the most important point of the invention is that the small grain size of the first and second deposit has to be maintained until step d) of the inventive method starts. Preferably after the electrochemical copper deposition step providing the first and second copper deposit and before converting in step d) no other converting step which might change the grain size of the copper grains of the first deposit and the second deposit is conducted, preferably no annealing step or any other step comprising heating is conducted, e.g. no annealing step having an annealing temperature above 100° C., preferably no annealing step from 100° C. to 200° C. for 1 hour is conducted. Preferably the time period after step a) and b) does not exceed 3 weeks, more preferable does not exceed 120 hours, even more preferable does not exceed 72 hours, until step c) and/or d) is conducted. Preferably the substrates of step a) and b) are stored during the time period at ambient temperature (in the range from 18 to 25 ° C.), preferably below or equal 25, more preferably in the range from 5° C. to 25 C.

Additionally, no surface modification of the bonding surface of the first deposit and second deposit after the electrochemical copper deposition step and/or before the connecting step c) by additional treatment steps in order to roughen the bonding surface is needed with the present invention and is therefore not applied and excluded from the method of the present invention. In particular the bonding surface of the first deposit and the bonding surface of the second deposit has a smooth surface without having a generated nanotexture structure. These additional structure leads to a surface roughness Ra of several hundreds of nanometers. With other words no nanostructured surface as nanotexture surface within the copper surface, e.g. by very dilute acid rinse, etching, polishing or other methods, is created on the bonding surface of the first and second deposit.

However, if needed, the surface roughness of the bonding surface after step a) and/or b) can be further reduced by CMP (chemical mechanical polishing). Further short CMP duration can be used for cleaning the bonding surface.

The electrochemical copper deposition step can be part of a process to provide structures onto the first and second substrate in form of the first deposit and the second deposit wherein the first and second deposit can be independently selected from the group consisting of a via, a bump, a pillar and/or a pad. Therefore, in principle every electrochemical copper deposition step can be used as long as the step provides good filling performance of the to be filled structures and which provide preferably smooth bonding surfaces of the first and second deposits. The process to provide structures in principle is known to the skilled person and can be e.g. a damascene process or a process wherein structured resists are filled with copper.

The electrochemical copper deposition step comprising preferably the use of an aqueous acid copper deposition bath comprising a source of copper ions, a sulphur-containing brightener compound, a suppressor compound, a leveller selected from the group consisting of guanidine-containing compound, urea-containing compound, imidazole-containing compound and pyridine-containing compound and halogenide ions. The bath has preferably a pH value of ≤2, more preferably of ≤1. All compounds can be purchased as products from Atotech Deutschland GmbH.

The source of copper ions is preferably selected from the group comprising copper sulfate and copper alkyl sulfonates such as copper methane sulfonate. The copper ion concentration in the aqueous acidic copper plating bath preferably ranges from 4 g/l to 90 g/L, more preferably 10 to 70 g/L, still more preferably from 30 to 65 g/L.

The acid is preferably selected from the group comprising sulfuric acid, fluoro boric acid, phosphoric acid and methane sulfonic acid and is preferably added in a concentration from 10 g/L to 400 g/L, more preferably from 20 g/L to 300 g/L, still more preferably 30 g/L to 300 g/L.

The sulphur-containing brightener compound is preferably selected from the group consisting of 3-(benzthiazolyl-2-thio)-propylsulfonic-acid, 3-mercaptopropan-1-sulfonic-acid, ethylendithiodi-propylsulfonic-acid, 3-N,N-dimethylaminodithiocarbamoyl-1-propanesulfonic acid and 3,3'-dithiobis-1-propanesulfonic acid (SPS) or salt thereof, preferably dithiobis-1-propanesulfonic acid (SPS). The concentration of all accelerator-brightener additives (in total) optionally present in the aqueous acidic copper bath compositions preferably ranges from 0.01 mg/L to 100 mg/L, more preferably from 0.05 mg/L to 20 mg/L still more preferably from 0.1 to 10 mg/L.

The suppressor compound is preferably selected from the group consisting of polyethylenglycol (PEG), polypropylenglycol, poly(ethylenglycol-ran-propylenglycol), polyethylenglycol/poly-propylenglycol-copolymers, poly(ethylenglycol)-block-poly(propylenglycol)-block-poly-(ethylenglycol), and poly(propylenglycol)-block-poly (ethylenglycol)-block-poly(propylenglycol), preferably polyethylenglycol or polyethylenglycol/polypropylenglycol-copolymers (PEG/PPG). Preferably the molecular weight (MW in [g/mol]) of the suppressor is from 4,000 to 8,000. The concentration of said optional carrier-suppressor additives (in total) preferably ranges from 0.005 g/L to 20 g/L, more preferably 0.01 20 g/L, still more preferably from 0.01 g/L to 5 g/L.

The guanidine-containing compound is a polymer compound having repeat units of a guanidine residue and a divalent residue. Example are disclosed in EP 3286358 B1 which are incorporated by reference and can be purchased from Atotech Deutschland GmbH. The concentration of the guanidine compound in the aqueous acidic copper plating bath ranges from 0.01 mg/L to 1000 mg/L, more preferably from 0.1 mg/L to 100 mg/L, still more preferably 0.5 mg/L to 50 mg/L.

The halogenide ions are preferably selected from Cl, Br, and/or I. In case of chloride, halogenide ions are preferably added in a concentration range from 10 to 200 mg/L, more preferably from 20 to 80 mg/L, or still more preferably from 30 to 60 mg/L. If other halogenide ion is chosen, a respective molar amount is preferably chosen, or if different halogenides are chosen, a respective total molar amount is chosen.

Preferably the electrochemical copper deposition step is performed by applying a current density of 1 to 2 ASD in order to obtain the first deposit and second deposit, wherein direct current (DC) plating and pulse plating can be used. In one embodiment the electrochemical copper deposition step is done by pulse plating e.g. forward and backward pulse or forward and off pulse currents and time.

The invention will now be illustrated by reference to the following figures and non-limiting examples.

EXAMPLES

FIG. 1 illustrates the formation of the copper-to-copper direct bonding according to the prior art (a) and according to the present invention (b).

It is known that prior art electrochemical deposited copper initially also consists of fine grains after deposition but will easily recrystallize to larger grains as function of temperature and time. The grains that do not grow further are supposed to lead to interface formation between the bonded components (FIG. 1*a*). In contrast, if bonding is performed with a grain size, which is closer to the initial state after deposition, grain growth over the bonding surfaces (interface) of the first and second deposit can be seen while the interface disappears (FIG. 1*b*).

Figure 2:
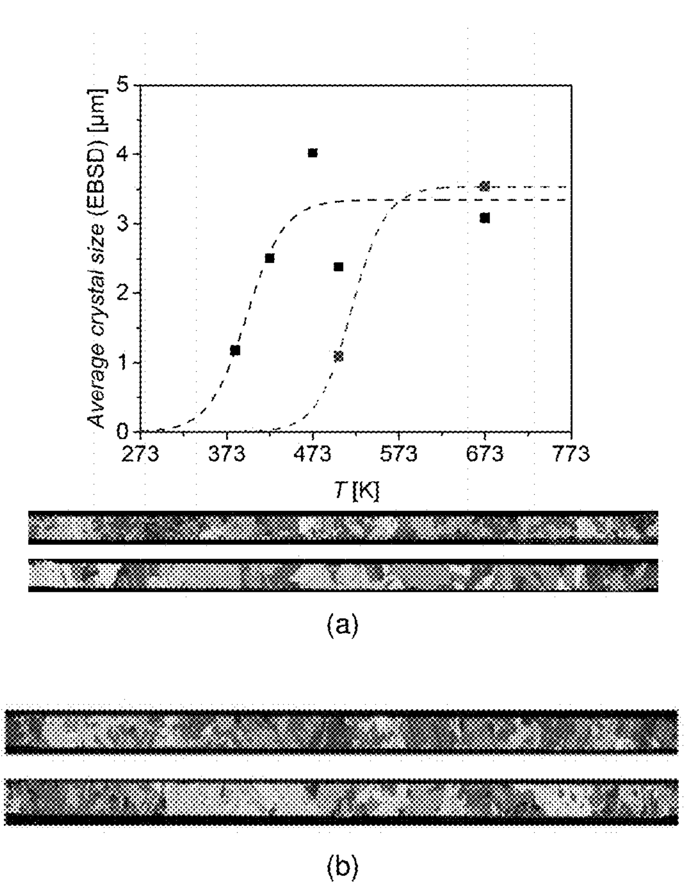
FIG. 2 illustrates a simulation of the converting step d).
Figure 3:
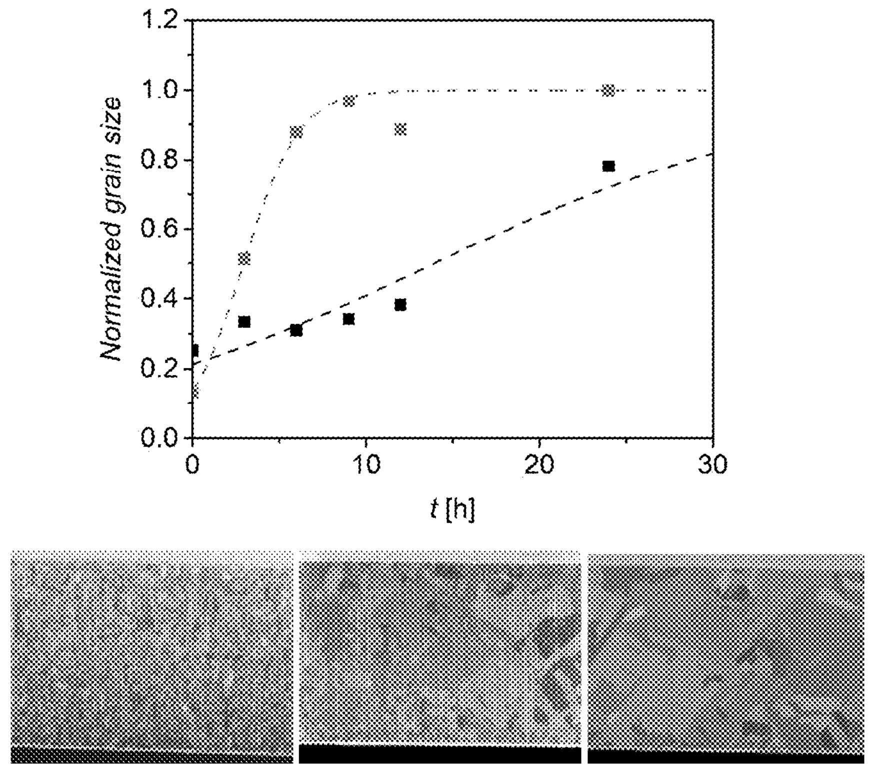
FIG. 3 illustrates normalized grain size of copper alloy and pure copper deposits.
Figure 4:
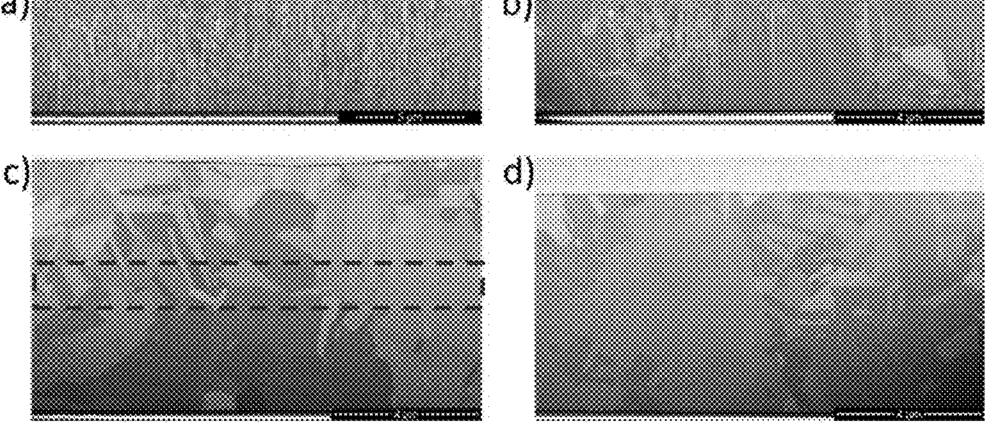
FIG. 4 illustrates FIB SEM micrographs of pure copper deposited under different parameters in time and temperature.

The following FIGS. 2 to 4 will support the findings in FIG. 1 which can be transferred to direct copper-to-copper bonding and leads to improved bonding strength and improved conductivity.

FIG. 2 simulates the converting step d) of the present invention, wherein one copper layer (first deposit) was annealed. FIG. 2 illustrates the influence of the annealing temperature over time of the average grain size of 4.5 μm thick copper deposits (having organic impurities of about 2,500 ppm on a substrate (comparative example) and pure copper deposits on a substrate (inventive example) after applying an annealing step for 1 h at different temperatures.

The annealing temperature of copper deposits may be adjusted by co-deposition of other elements, both inorganic and organic. Co-deposition of inorganic elements, especially other metals, leads to formation of alloys, which may suffer from lower conductivity in comparison to pure copper. Organic impurities usually originate from co-deposition of organic plating additives.

Proper additive design was shown to result in considerably purer deposits. This approach was employed to lower the temperature that is required for annealing of the copper material. The grain size of different layers prepared by electrodeposition after annealing for 1 h at different temperatures was determined by EBSD (FIG. 2*a*). Deposits prepared from electrolyte 1 required significantly higher temperatures to obtain the final grain size in comparison to electrolyte 2. Both electrolytes resulted in similar grain size after annealing at high temperatures, which was in the order of the deposit thickness (4.5 μm). The respective amounts of co-deposited impurities were determined by dynamic secondary ion mass spectrometry (DSIMS) and the results confirmed higher values for electrolyte 1 (Table I below). Differential scanning calorimetry (DSC) investigations showed exothermic peaks and further supported that the copper with larger amount of impurities requires higher temperatures for crystallization (Table I below). Electrolyte 1 was based on conventional plating organic additives that tend to significant co-deposition, while electrolyte 2 consisted of optimized additives, which allowed for high purity of the final layer.

The upper limit for copper-to-copper bond formation for hybrid bonding applications was discussed to be 200° C. Thus, the copper material should reach its maximal grain size at such temperature. FIG. 2*a* shows that deposits from both electrolytes eventually reached grain sizes of approximately 3.5 μm, which were close to the thickness of the deposit. However, electrolyte 1 requires temperatures of more than 300° C. In contrast, electrolyte 2 produces copper that reached the maximum grain size at temperatures of ca. 200° C. The average grain sizes including twins at 200° C. reached the maximum within error range for electrolyte 1, however remains at values 1.1 μm even at 230° C. The corresponding EBDS images are depicted in FIG. 2*b*. Comparison of the grain sizes of electrolytes 1 and 2 at this temperature range confirms the potential suitability of electrolyte 2.

FIG. 2*a* directly shows the average grain size including twins of 4.5 μm thick copper deposits obtained from electrolyte 1 (grey) and 2 (black) determined by EBSD after annealing for 1 h at different temperatures (top). Examples of the corresponding EBSD images for electrolyte 2 after annealing for 1 h at 110° C. and 400° C., respectively (bottom).

FIG. 2*b*. directly shows EBSD images of 4.5 μm thick copper deposits obtained from electrolyte 1 (top) and 2 (bottom) after annealing for 1 h at 230° C.

Deposits were prepared from electrolyte 1 (comparative example—(Comp. Ex) required significantly higher temperatures to obtain the final grain size in comparison to electrolyte 2 (inventive example 1—(Inv. Ex1)). Both electrolytes resulted in similar grain size after annealing at high temperatures, which was in the order of the deposit thickness (4.5 μm). The respective amounts of co-deposited impurities were determined by dynamic secondary ion mass spectrometry (DSIMS) and the results confirmed higher values for electrolyte 1 (Table I). Differential scanning calorimetry (DSC) investigations showed exothermic peaks and further supported that the copper with larger amount of impurities requires higher temperatures for crystallization (Table I). Electrolyte 1 was based on conventional plating organic additives that tend to significant co-deposition, while electrolyte 2 consisted of optimized additives, which allowed for high purity of the final layer.

TABLE 1

Total impurities and crystallization temperatures TC of deposits prepared from different electrolytes

| System | Total impurities[a] [ppm] | $T_C$[b] [° C.] |
|---|---|---|
| Electrolyte 1 (Comp. Ex) | 2694 | 153 |
| Electrolyte 2 (Inv. Ex1) | 55 | 115 |

[a]Determined by DSIMS
[b]Determined by DSC

Electrolyte 1 (Comp. Ex):
- 2 mg/L sulphur-containing brightener SPS
- 300 mg/L Suppressor compound PEG (MW 6000)
- 0.1 mg/L Leveller PEI (MW 600)
- Deposition with 5 ASD, temperature 25° C.
- Annealing with over 200° C. after deposition Electrolyte 2 (Inv. Ex):
- 4 mg/L sulphur-containing brightener SPS
- 10 mL/L Suppressor compound PEG/PPG Copolymer (MW 6000)
- 20 mL/L guanidine-containing compound Spherolyte Leveller DB by Atotech®
- Deposition with 1 ASD, temperature 25° C.
- Annealing with 200° C. for 1 h after deposition in step d)

FIG. 3 illustrates normalized grain size of copper alloy (comparative example) and pure copper deposits (inventive example), wherein one copper layer (first deposit) was investigated over time at room temperature. FIG. 3 shows a normalized grain size of deposits prepared from electrolyte 2 with parameter sets 1 (5 ASD DC, 25° C.) (grey) and 2 (1 ASD DC, 25° C.) (black) as function of time at room temperature (top) is shown. Examples of the corresponding microstructures directly after deposition (left), after 12 h (middle), and 24 h (right).

All Process Steps Prior Step d 9 are performed at room (ambient) temperature or below, in particular the deposition process itself, the connecting step c) and e.g. the CMP process. Thus, a morphology similar to the initial structure after deposition should be maintained as long as possible to allow for sufficient time to perform all necessary process steps before step d) copper-to-copper bonding at elevated temperatures.

To investigate the timescale of the changes of the microstructures, the grain sizes of deposits prepared from electrolyte 2 (above) were determined after different times at room temperature (FIG. 3). The grain growth at room temperature is usually denoted as self-annealing. The time after which the maximum grain size was obtained could be modified by the process parameters of the electrolytic deposition. The maximum grain size was obtained after approximately 9 h using parameters 1. This may not be sufficient to be implemented into a production sequence. In contrast, deposits prepared with parameters 2 required more than 24 h until no further grain growth was observed at room temperature. This time was much longer and, therefore, more suitable for current industrial production process flows.

FIG. 4 simulates the converting of the deposits in a bonding process wherein different deposits were investigated over time and different temperatures. FIG. 4 illustrates FIB SEM micrographs of pure copper deposits deposited under different parameters in time and temperature, wherein it is shown FIB SEM micrographs of copper deposited from electrolyte 2 with parameters 2 1 (ASD DC, 25° C.) wherein it can be seen in:

FIG. 4*a*) a single 4.5 μm layer after deposition (simulates first deposit of the first substrate).

FIG. 4*b*) a single 4.5 μm layer after 24 h at room temperature (simulates first deposit of the first substrate).

FIG. 4*c*) two consecutively deposited 4.5 μm layers after annealing for 1 h at 200° C., whereat the second layer was deposited after self-annealing of the first layer for 24 h at room temperature (simulates the conversion of a first deposit of the first substrate and the second deposit of the second substrate according to a non-inventive example).

FIG. 4*d*) two consecutively deposited 4.5 μm layers after annealing for 1 h at 200° C., whereat the second layer was deposited directly after deposition of the first layer (simulates the conversion of a first deposit of the first substrate and the second deposit of the second substrate according to the invention).

The ability of deposits of the initial microstructure of small grains to further grow across an interface (attached bonding surfaces of the first and second deposit) was probed by two consecutive electrochemical deposition steps with different annealing conditions in between. A 4.5 μm thick first deposit was prepared from electrolyte 2 with process parameters 2 initially exhibit small grains (FIG. 4*a*) that grow considerably within 24 h at room temperature as self-annealing (Figure b). A second electrodeposition step under the same conditions was performed on the initial as well as the self-annealed microstructures. After deposition of the two layers, the overall stack was annealed for 1 h at 200° C. to mimic the thermal load during copper-to-copper bonding. An interface was observed after annealing in case the second layer was deposited on the self-annealed first layer. (FIG. 4*c*—not inventive). In contrast, no interface and grain growth over the entire deposit consisting of the two consecutively deposited layers could be detected, if the second layer was deposited on the first layer still in its initial microstructure (FIG. 4*d*).

FIG. 5 illustrates FIB SEM micrographs of the formation of the copper-to-copper direct bonding within a wafer pair according to the invention and according to a comparative example.

Four 300 mm DBI5 wafers were provided as two first substrates and two second substrate according to step a) and b) of the invention wherein the first substrate further comprises a first nonconductive material, having a bonding surface and confining the first deposit and wherein the second substrate comprises further a second nonconductive material having a bonding surface and confining the second deposit. Both substrates are made from the same nonconductive material and the first and the second copper deposit are formed by the same electrochemical copper deposition step. The electrochemical copper deposition step was performed with electrolyte 2 (inventive example 1—(Inv. Ex1)). All steps were conducted within 24 hours.

Inventive Example 60 min after the electrochemical copper deposition after the electrochemical copper deposition, two wafer (first and second substrate) were treated with a short CMP step. As explained in the general description, the CMP step was shortly conducted, mainly to clean the surfaces of the copper deposits. However, the polishing time and waste could be reduced. Subsequently, the two wafer were connected at ambient temperature (step c) and annealed below 200° C. for 60 min according to step d).

Figure 5A:
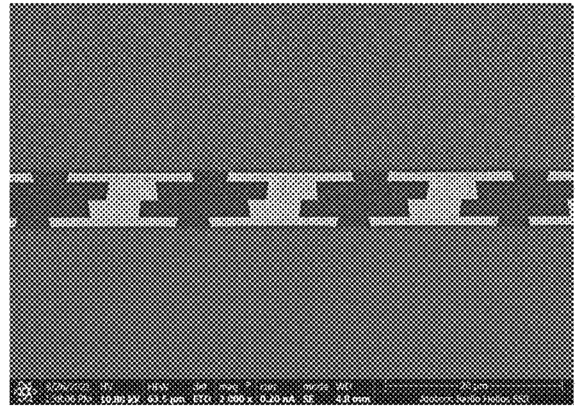
FIG. 5 illustrates FIB SEM micrographs of the formation of the copper-to copper direct bonding within a wafer pair according to the invention.

FIG. 5*a* shows a FIB SEM micrograph of the resulting copper-to-copper bonded wafer pair at a magnitude of 2 k.

It can be seen that the connected and converted deposit is formed by grains going through first deposit to the second deposit and vice versa wherein no distinct interface is going to disappear and at least partly not visible between the first and second deposit.

Figure 5B:
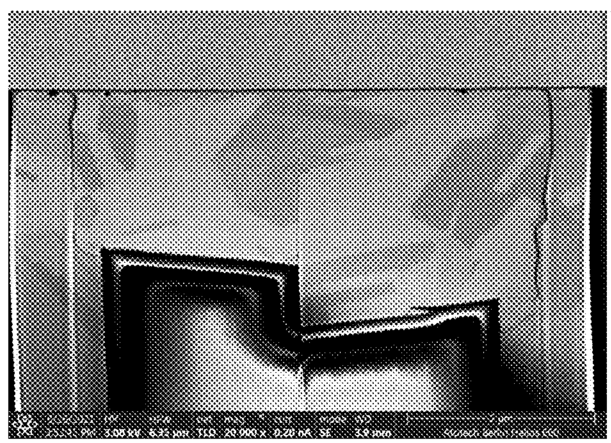
Figure 5C:
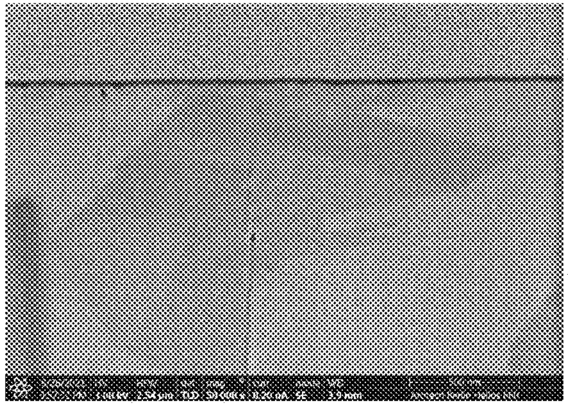

FIG. 5*b* shows another FIB SEM micrograph of this copper-to-copper bonded wafer pair at a magnitude of 20 k wherein the view of FIG. 5*a* was rotated by 90° and FIG. 5*c* shows a FIB SEM micrograph of the same wafer pair at a magnitude of 50 k.

It can be seen that the converted deposit has no clear detectable bonding surface (interface) between the former first deposit and the former second deposit. That means that during the converting step d) the grain size of the grains grew, and the formed copper grains extend through the bonding surface of the first deposit and second deposit into the respective other deposit.

Comparative Example 60 min after the electrochemical copper deposition, the wafers (first and second substrate) were treated with an annealing step at 200° C. for 60 min to force the grain growing due to heat treatment. After this step, the two wafers (first and second substrate) were treated with a short CMP step. Subsequently, the two wafers were connected and again annealed at 200° C. for 60 min according to steps c) and d).

Figure 6A:
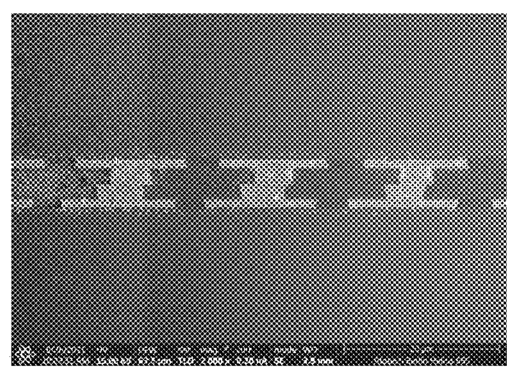
FIG. 6 illustrates FIB SEM micrographs of the formation of the copper-to copper direct bonding within a wafer pair according to a comparative example.

FIG. 6*a* shows a FIB SEM micrograph of the resulting copper-to-copper bonded wafer pair at a magnitude of 2 k.

It can be seen that the formed connected deposit shows a visible distinct interface between the first and second deposit, wherein the surface of the deposits shows no parts which are merged into the other surface of the deposit.

Figure 6B:
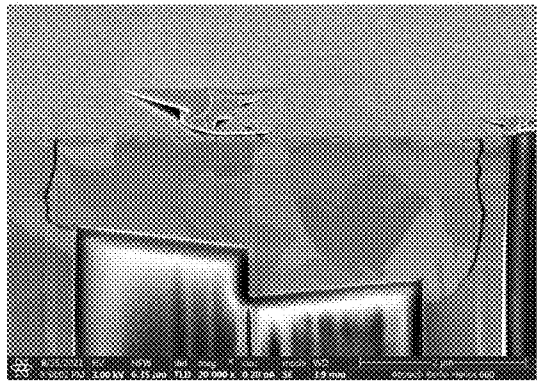
Figure 6C:
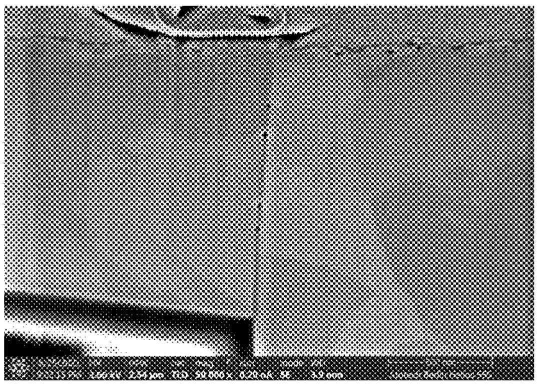

FIG. 6*b* shows another FIB SEM micrograph of this copper-to-copper bonded wafer pair at a magnitude of 20 k wherein the view of FIG. 6*a* was rotated by 90° and FIG. 6*c* shows a FIB SEM micrograph of the same wafer pair at a magnitude of 50 k.

It can be seen that the formed deposit has a visible bonding surface (interface) between the former first deposit and the former second deposit and that the grown grains are not going through the bonding surfaces of the deposits or with other words no grains which are prolong over the whole area of first and second deposit.

That means that during the first heat treatment (first annealing step before step c) the converting took place and finished within each deposit (first and second deposit). The further annealing step in step d) could not initiate further grain size growing. In particular, the size of the grains did not increase further, and the copper grains did not extend through the bonding surface of the first deposit and second deposit into the respective other deposit, because the grain size growth was already finished within the first annealing step.

The invention claimed is:

1. Method for copper-to-copper direct bonding comprising the steps:

a) providing a first substrate comprising a first pure copper deposit having a bonding surface;

b) providing a second substrate comprising a second pure copper deposit having a bonding surface;

c) connecting the bonding surface of the first pure copper deposit with the bonding surface of the second pure copper deposit and obtaining a connected deposit; and d) converting the first and the second pure copper deposit of the connected deposit into a connected and converted deposit, wherein the first pure copper deposit and the second pure copper deposit are formed by an electrochemical copper deposition step and having copper grains with a grain size which is smaller than a grain size after the converting in step d), wherein the connected and converted deposit is having grains with a grain size which is larger than the grain size of the first pure copper deposit and the second pure copper deposit before the converting in step d) and wherein the step d) is conducted by applying an annealing step having an annealing temperature equal to or less than 200° C., wherein the grain size is growing during converting step d) and the formed copper grains extend through the bonding surface of the first pure copper deposit and second pure copper deposit into the second pure copper deposit and vice versa.

2. Method according to claim 1 wherein the annealing step is conducted for a time period from 10 min to 90 min.

3. Method according to claim 1, wherein the surface roughness Ra of the bonding surface of the first pure copper deposit and second pure copper deposit is below 200 nm.

4. Method according to claim 1 wherein the grains of the first pure copper deposit and the second pure copper deposit having the smaller grain size are more that 90% converted into the grains of the larger grain size of the connected deposit wherein the grains of the larger grain size are going through the connected deposit.

5. Method according to claim 1 wherein the connected deposit has no or at least partly no detectable bonding surface (interface) between the former first deposit and the former second deposit by focused ion beam scanning electron microscopy (FIB SEM) after converting step d).

6. Method for copper-to-copper direct bonding comprising the steps:

a) providing a first substrate comprising a first pure copper deposit having a bonding surface;

b) providing a second substrate comprising a second pure copper deposit having a bonding surface;

c) connecting the bonding surface of the first pure copper deposit with the bonding surface of the second pure copper deposit and obtaining a connected deposit; and d) converting the first pure copper deposit and the second pure copper deposit of the connected deposit into a connected and converted deposit, wherein the first pure copper deposit and the second pure copper deposit are formed by an electrochemical copper deposition step and having copper grains with a grain size which is smaller than a grain size after the converting in step d), wherein the connected and converted deposit is having grains with a grain size which is larger than the grain size of the first pure copper deposit and the second pure copper deposit before the converting in step d) and wherein the step d) is conducted by applying an annealing step having an annealing temperature equal to or less than 200° C., wherein the grain size is growing during converting step d) and the formed copper grains extend through the bonding surface of the first pure copper deposit and second pure copper deposit into the second pure copper deposit and vice versa, and wherein after the electrochemical copper deposition step and before connecting of step c) no converting step which changes the grain size of the copper grains of the first pure copper deposit and the second pure copper deposit is conducted.

7. Method for copper-to-copper direct bonding comprising the steps:

a) providing a first substrate comprising a first pure copper deposit having a bonding surface;

b) providing a second substrate comprising a second pure copper deposit having a bonding surface;

c) connecting the bonding surface of the first pure copper deposit with the bonding surface of the second pure copper deposit and obtaining a connected deposit; and d) converting the first pure copper deposit and the second pure copper deposit of the connected deposit into a connected and converted deposit, wherein the first pure copper deposit and the second pure copper deposit are formed by an electrochemical copper deposition step and having copper grains with a grain size which is smaller than a grain size after the converting in step d), wherein the connected and converted deposit is having grains with a grain size which is larger than the grain size of the first pure copper deposit and the second pure copper deposit before the converting in step d) and wherein the step d) is conducted by applying an annealing step having an annealing temperature equal to or less than 200° C., wherein the grain size is growing during converting step d) and the formed copper grains extend through the bonding surface of the first pure copper deposit and second pure copper deposit into the second pure copper deposit and vice versa, and wherein the method is a direct hybrid bonding method wherein the first substrate comprises further a first nonconductive material having a bonding surface and at least partially confining the first pure copper deposit and wherein the second substrate comprises further a second nonconductive material having a bonding surface and at least partially confining the second pure copper deposit, wherein the bonding surface of the first pure copper deposit and second pure copper deposit is below the surface of the bonding surface of the first and second nonconductive material.

8. Method for copper-to-copper direct bonding comprising the steps:

a) providing a first substrate comprising a first pure copper deposit having a bonding surface;

b) providing a second substrate comprising a second pure copper deposit having a bonding surface;

c) connecting the bonding surface of the first pure copper deposit with the bonding surface of the second pure copper deposit and obtaining a connected deposit; and d) converting the first pure copper deposit and the second pure copper deposit of the connected deposit into a connected and converted deposit, wherein the first pure copper deposit and the second pure copper deposit are formed by an electrochemical copper deposition step and having copper grains with a grain size which is smaller than a grain size after the converting in step d), wherein the connected and converted deposit is having grains with a grain size which is larger than the grain size of the first pure copper deposit and the second pure copper deposit before the converting in step d) and wherein the step d) is conducted by applying an annealing step having an annealing temperature equal to or less than 200° C., wherein the grain size is growing during converting step d) and the formed copper grains extend through the bonding surface of the first pure copper deposit and second pure copper deposit into the second pure copper deposit and vice versa, and wherein the electrochemical copper deposition step comprising the use of an aqueous acid copper deposition bath which is operated in a temperature range of 15° C. to 40° C.

9. Method according to claim 1 wherein the electrochemical copper deposition step comprising the use of an acid copper deposition bath comprising a source of copper ions, a sulphur-containing brightener compound, a suppressor compound, a leveller selected from the group consisting of guanidine-containing compound, urea-containing compound, imidazole-containing compound and pyridine-containing compound and halogenide ions.

10. Method according to claim 1 wherein the electrochemical copper deposition step is performed by applying a current density from 1 to 2 $A/dm^2$ in order to obtain the first pure copper deposit and/or second pure copper deposit.

11. Method according to claim 1 wherein the bonding surface of the first pure copper deposit and the bonding surface of the second pure copper deposit has a smooth surface.

12. Method according to claim 1 wherein no surface modification of the bonding surface of the first pure copper deposit and second pure copper deposit after the electrochemical copper deposition step and/or before the connecting step c) is applied.

13. Method according to claim 1 wherein step c) connecting the bonding surface of the first pure copper deposit with the bonding surface of the second pure copper deposit and obtaining a connected deposition is achieved by pressing the first and second bonding surface of the nonconductive material of the first and second substrate together under pressure.

14. Method according to claim 13 wherein the pressure is applied with a contact force from 1 to 5,000 N.

15. Method for copper-to-copper direct bonding comprising the steps:

a) providing a first substrate comprising a first pure copper deposit having a bonding surface;

b) providing a second substrate comprising a second pure copper deposit having a bonding surface;

c) connecting the bonding surface of the first pure copper deposit with the bonding surface of the second pure copper deposit and obtaining a connected deposit; and d) converting the first pure copper deposit and the second pure copper deposit of the connected deposit into a connected and converted deposit, wherein the first pure copper deposit and the second pure copper deposit are formed by an electrochemical copper deposition step and having copper grains with a grain size which is smaller than a grain size after the converting in step d), wherein the connected and converted deposit is having grains with a grain size which is larger than the grain size of the first pure copper deposit and the second pure copper deposit before the converting in step d) and wherein the step d) is conducted by applying an annealing step having an annealing temperature equal to or less than 200° C., wherein the grain size is growing during converting step d) and the formed copper grains extend through the bonding surface of the first pure copper deposit and second pure copper deposit into the second pure copper deposit and vice versa, wherein step c) connecting the bonding surface of the first pure copper deposit with the bonding surface of the second pure copper deposit and obtaining a connected deposition is achieved by pressing the first and second bonding surface of the nonconductive material of the first and second substrate together under pressure, and wherein step c) connecting the bonding surface of the first pure copper deposit with the bonding surface of the second pure copper deposit and obtaining a connected deposition is conducted at a temperature under 100° C.

16. Method according to claim 14 wherein step c) connecting the bonding surface of the first pure copper deposit with the bonding surface of the second pure copper deposit and obtaining a connected deposition is conducted at a temperature under 100° C.

* * * * *